US012637786B2

(12) United States Patent
Haeckl et al.

(10) Patent No.: US 12,637,786 B2
(45) Date of Patent: May 26, 2026

(54) METHOD FOR PRODUCING A GALLIUM OXIDE LAYER ON A SUBSTRATE

(71) Applicant: SILTRONIC AG, Munich (DE)

(72) Inventors: Walter Haeckl, Kirchweidach (DE); Ta-Shun Chou, Berlin (DE); Andreas Popp, Eichwalde (DE)

(73) Assignee: SILTRONIC AG, Munich (DE)

( * ) Notice: Subject to any disclaimer, the term of this patent is extended or adjusted under 35 U.S.C. 154(b) by 330 days.

(21) Appl. No.: 18/579,515

(22) PCT Filed: Jul. 12, 2022

(86) PCT No.: PCT/EP2022/069433
§ 371 (c)(1),
(2) Date: Jan. 16, 2024

(87) PCT Pub. No.: WO2023/001630
PCT Pub. Date: Jan. 26, 2023

(65) Prior Publication Data
US 2024/0309552 A1 Sep. 19, 2024

(30) Foreign Application Priority Data

Jul. 22, 2021 (EP) .................................... 21187231

(51) Int. Cl.
*C30B 25/16* (2006.01)
*C30B 29/16* (2006.01)
(52) U.S. Cl.
CPC ............ *C30B 25/165* (2013.01); *C30B 25/16* (2013.01); *C30B 29/16* (2013.01)
(58) Field of Classification Search
CPC ....... C30B 25/02; C30B 25/16; C30B 25/165; C30B 29/16
See application file for complete search history.

(56) References Cited

U.S. PATENT DOCUMENTS

2005/0148199 A1* 7/2005 Jansen .............. C23C 16/45544
438/761
2013/0209685 A1* 8/2013 Ku ........................ C23C 16/407
427/255.26
(Continued)

FOREIGN PATENT DOCUMENTS

EP 1854904 A1 11/2007
EP 3242965 A1 11/2017

OTHER PUBLICATIONS

Runde et al "Stable 2D Conductive Ga/Ga(OxHy) Multilayers with Controlled Nanoscale Thickness Prepared from Gallium Droplets with Oxide Skin" Adv. Mater. Interfaces 2018, 5, 1800323 pp. 1-7.*
(Continued)

*Primary Examiner* — Robert M Kunemund
(74) *Attorney, Agent, or Firm* — LEYDIG, VOIT & MAYER, LTD.

(57) ABSTRACT

A $\beta$-$Ga_2O_3$ layer is grown on a substrate by: performing a first deposition cycle at a first growth rate using oxygen and a precursor including Ga, the first deposition cycle having a thickness of at least 3 atomic layers of $\beta$-$Ga_2O_3$ and at most 20 atomic layers of $\beta$-$Ga_2O_3$; determining a regression curve for a layer surface reflectivity using tuples of a measured first layer surface reflectivity and having a first layer thickness; and performing a second deposition cycle including measuring a second layer thickness and a second layer surface reflectivity, with a predetermined second growth rate determined from the first growth rate multiplied by a correction factor, having a defined lower and upper limit.

6 Claims, 4 Drawing Sheets

(56)                    References Cited

U.S. PATENT DOCUMENTS

| | | | |
|---|---|---|---|
| 2014/0174342 A1* | 6/2014 | Pore | C23C 16/45553 |
| | | | 117/88 |
| 2020/0002813 A1* | 1/2020 | Shu | C23C 16/45519 |
| 2020/0292299 A1 | 9/2020 | Iyechika | |

OTHER PUBLICATIONS

O'Donoghue et al "Low temperature growth of gallium oxide thin films via plasma enhanced atomic layer deposition" Dalton tranactions 2017 vol. 46 16551-16561.*

Schewski et al, Step-Flow Growth In Homoepitaxy of $\beta$-Ga$_2$O$_3$(100)—The Influence of the Miscut Direction and Faceting, APL Materials, Dec. 2018, pp. 7.022515-1 till 7.022515-7. vol. 7, issue 2, American Institute of Physics (AIP) Publishing, DOI: 10.1063/1.5054943.

Cheng et al, Growth Mode Evolution During (100)-Oriented $\beta$-Ga$_2$O$_3$homoepitaxy, Nanotechnology, Jul. 2018, p. 395705 (6pp), vol. 29, IOP Publishing Ltd, UK, DOI: 10.1088/1361-6528/AAD21B.

Bhattacharyya, Low Temperature Homoepitaxy of (010) $\beta$-Ga$_2$O$_3$ by Metalorganic Vapor Phase Epitaxy: Expanding the Growth Window, Applied Physics Letters, Oct. 2020, pp. 142102-1 till 142102-6, vol. 117, issue 14, AIP Publishing, DOI: 10.1063/5.0023778.

Sbrockey et al., Large-Area MOCVD Growth of Ga$_2$O$_3$ in a Rotating Disc Reactor, Journal of Electronic Materials, Dec. 2014, pp. 1357-1360, vol. 44, No. 5, The Minerals, Metals & Materials Society, DOI 10.1007/s11664-014-3566-7.

Bin Anooz et al., Step flow growth of $\beta$-Ga$_2$O$_3$ thin films on vicinal (100) $\beta$-Ga$_2$O$_3$ substrates grown by MOVPE, Applied Physics Letters 116, May 2020, 182106-182106-5, AIP Publishing, DOI 10.1063/5.0005403.

* cited by examiner

METHOD FOR PRODUCING A GALLIUM OXIDE LAYER ON A SUBSTRATE

CROSS REFERENCE TO RELATED APPLICATIONS

This application is a U.S. National Phase application under 35 U.S.C. § 371 of International Application No. PCT/EP2022/069433, filed on Jul. 12, 2022, and claims benefit to European Patent Application No. EP 21187231.2, filed on Jul. 22, 2021. The International Application was published in English on Jan. 26, 2023 as WO 2023/001630 A1 under PCT Article 21(2).

FIELD

The present disclosure relates to a method for growing a layer of $\beta$-$Ga_2O_3$ on a substrate with improved electrical properties.

BACKGROUND

The growth of high-quality $\beta$-$Ga_2O_3$ thin film has received much attention recently due to its outstanding properties, including a large bandgap up to 4.9 eV, a high breakdown field of up to 8 MV/cm, and its wide range of electronic and electro-optic device applications.

Unlike other wide bandgap materials such as SiC and GaN, high-quality $\beta$-$Ga_2O_3$ single crystals can be grown directly from the melt, making the cost of substrate fabrication more economical. Many techniques have been investigated for the deposition of $\beta$-$Ga_2O_3$ layers to meet device fabrication requirements, including pulsed laser deposition (PLD), atomic layer deposition (ALD), molecular beam epitaxy (MBE) and metalorganic vapor phase epitaxy (MOVPE). Among these techniques, deposition of $\beta$-$Ga_2O_3$ layers by MOVPE offers many advantages for device fabrication, including homogeneous deposition across device topography and the ability for large-scale production.

N. M. Sbrockey et al. (N. M. Sbrockey, T. Salagaj, E. Coleman, G. S. Tompa, Y. Moon, and M. S. I. K. Kim, "Large-Area MOCVD Growth of $Ga_2O_3$ in a Rotating Disc Reactor," J. Electron. Mater., vol. 44, no. 5, pp. 1357-1360, 2015,) and A. Bhattacharyya et al. (A. Bhattacharyya, P. Ranga, S. Roy, J. Ogle, L. Whittaker-Brooks, and S. Krishnamoorthy, "Low temperature homoepitaxy of (010) $\beta$-$Ga_2O_3$ by metalorganic vapor phase epitaxy: Expanding the growth window," Appl. Phys. Lett., vol. 117, no. September 2020, doi: 10.1016/j.jcrysgro.2019.01.018.) describe a state of the art process for MOVPE.

The growth mode of homoepitaxially grown thin layers of (100) $\beta$-$Ga_2O_3$ can be classified into three categories: (1) step-flow, (2) step-bunching, and (3) 2D-island growth. The step-flow growth mode is most desirable since it allows the growth of layers with improved electrical properties.

Bin Anooz et al. (Bin Anooz, S. et al. Step flow growth of $\beta$-$Ga_2O_3$ thin films on vicinal (100) $\beta$-$Ga_2O_3$ substrates grown by MOVPE. Appl. Phys. Lett. 116, 182106; doi 10.1063/5.0005403 (2020).) reported that the step-flow growth mode, which results in a smooth layer surfaces and a high crystalline quality, could only be achieved if the diffusion length on the layer surface corresponds approximately to the width of the terraces. Otherwise, 2D islands or step-bunching is obtained, which results in a deteriorated crystalline quality and reduced Hall mobility of the electrons. By varying the growth parameters such as the O2/Ga ratio, Ar push gas flow, and chamber pressure, the diffusion length could be adjusted so that step-flow growth mode could be achieved various miscut angles.

SUMMARY

In an embodiment, the present disclosure provides a method for growing a $\beta$-$Ga_2O_3$ layer on a substrate by: providing the substrate; performing a first deposition cycle at a first growth rate using oxygen and a precursor comprising Ga, the first deposition cycle having a thickness of at least 3 atomic layers of $\beta$-$Ga_2O_3$ and at most 20 atomic layers of $\beta$-$Ga_2O_3$; determining a regression curve for a layer surface reflectivity using a plurality of tuples of a measured first layer surface reflectivity and a corresponding first layer thickness; and performing a second deposition cycle including measuring a second layer thickness and a second layer surface reflectivity, with a predetermined second growth rate determined from the first growth rate multiplied by a correction factor F. The correction factor F is greater than a lower limit $L_l$, which is calculated as $L_l=0.995-Ref\times0.475$, and is smaller than an upper limit $L_u$, which is calculated as $L_u=1-Ref\times0.25$. Ref represents a dimensionless layer surface reflectivity index calculated from the quotient of the measured second layer surface reflectivity and the extrapolated layer surface reflectivity from the regression curve evaluated at the second layer thickness.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

The obtained quality of the surface of $\beta$-$Ga_2O_3$ layers is essential for the further processing of the wafers. The state of the art offers many possibilities to measure the quality of the wafers provided with a layer, and thus, to assess their quality. Bin Anooz et al. for example show that an atomic force microscope (AFM) can be utilized to distinguish between the different growth modes that can occur during growth (i.e. step-flow growth, 2D island growth or step-bunching). Unfortunately, the prerequisite for the use of an AFM is that the growth of the layer on the wafer is already finished.

Furthermore, the prior art does not provide any reference to a suitable measurement technique to obtain an indication of the quality of the surface during deposition.

Only after a deposition step is finished the quality of a semiconductor wafer can be determined, which means that more semiconductor wafers have to be discarded, which would not have been the case if any deviations had been detected early on during the deposition process. If the deviations were detected during the deposition process, it would be possible to intervene and either stop the deposition process early if it appears to be unsuccessful or make corrections in order to achieve the required quality. Even stopping the process at an early stage leads to the advantage of saving time and thus increasing economic efficiency.

In a deposition process, especially in an industrial environment, deviations from a theoretically ideal process control inevitably occur. These deviations can be of a systematic or statistical nature. The longer a deposition process takes, the more likely it is that a statistical deviation will cause losses in quality. This essentially means that it is effectively impossible to achieve a large film thickness without having to neglect quality.

Therefore, it is highly desirable to avoid the loss of a high percentage of the produced material due to quality issues.

According to an aspect of the present disclosure, a method is provided for producing a Gallium oxide layer ($\beta$-$Ga_2O_3$) on a substrate.

The resistivity of the deposited layer can be measured with the van der Pauw method. The van der Pauw method is a 4 point-method to determine the in-plane sheet resistance of homogeneous thin samples. The method is independent of the shape of the sample. If the thickness of the sample is known, it is easily possible to determine the in-plane resistivity. Furthermore, it is also possible to perform Hall measurements.

Figures 1A, 1B:
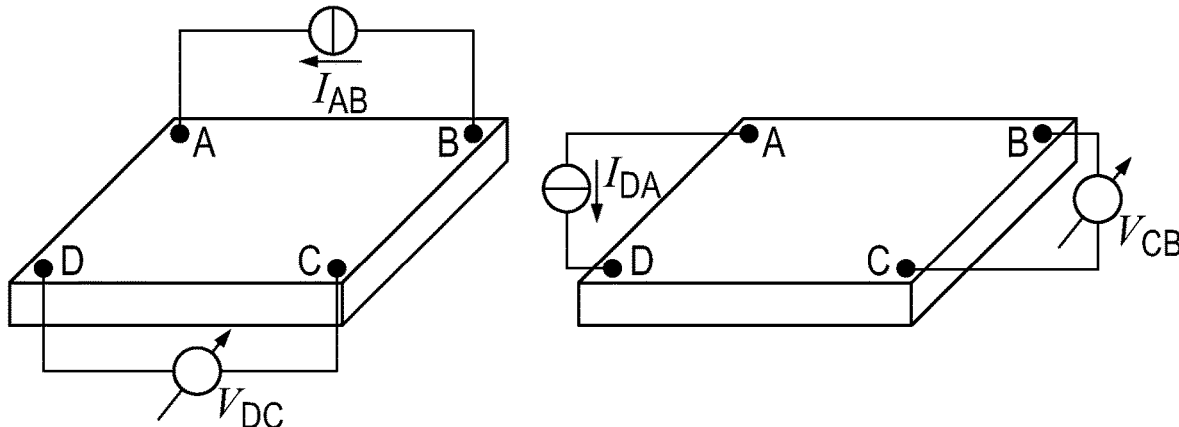
FIG. 1a is a schematic of the van der Pauw method for a square shaped sample having four contacts namely A, B, C, D.
FIG. 1b is a schematic of the Hall measurement method for a square shaped sample.

FIG. 1$a$ is a schematic of the van der Pauw method for a square shaped sample having four contacts namely A, B, C, D. The voltage (V) is measured between two neighboring contacts opposite the two current (I) contacts. These configurations were measured in both direction respectively with positive current and negative current.

FIG. 1$b$ is a schematic of the Hall measurement method for a square shaped sample: The voltage (VCA) is measured between two non-adjacent contacts. Orthogonal to the voltage the current (IBD) is applied between the other two contacts. Also orthogonal to current and orthogonal to voltage a magnetic field (B) is applied.

The requirements for the van der Pauw method are:

(i) the contacts should be at the edge of the sample.

(ii) it is very advantageous if the sample has a homogeneous thickness (iii) there must not be any topological holes in the sample or particles on the surface of the sample, the film has to be self-contained.

For the investigated samples, the requirements (1) and (3) are fulfilled, and requirement (2) is sufficient fulfilled, with a maximum deviation of the layer thickness of 5%.

The resistance is calculated by evaluating the slope of the resultant V(I)-curve, which is to be checked for linearity for the assurance of ohmic contacts. The resistance should be measured in the horizontal and vertical configuration (see FIG. 1 $a$). The resistances are:

$$R_{AB,DC} = \frac{V_{DC}}{I_{AB}} \text{ and } R_{DA,CB} = \frac{V_{CB}}{I_{DA}}$$

whereby the indices stand for the configuration of one I(V) sweep. Both configurations are measured with positive and negative current, which should give the same results at full ohmic behavior.

The resistivity is then calculated by the van der Pauw formula $$\rho = \frac{\pi d}{\ln 2} \frac{R_{AB,DC} + R_{BA,CD} + R_{DA,CB} + R_{AD,BC}}{4} f$$

where d is the thickness of the sample and f is a form factor from the transcendental equation:

$$\cosh\left(\frac{R_{AB,DC}/R_{DA,CB} - 1}{R_{AB,DC}/R_{DA,CB} + 1} \frac{\ln 2}{f}\right) = \frac{1}{2}\exp\left(\frac{\ln 2}{f}\right)$$

The Hall coefficient is to be determined using the same van der Pauw sample. The current $I_{BD}$ is applied between two non-adjacent contacts and the voltage $V_{CA}$ is measured orthogonal between the other two contacts (see FIG. 1 $b$). The magnetic field B is applied perpendicular to the film.

Hence, the charge carriers experience a force F $$F = q(E + v_D \times B)$$

with E being the electric field, $v_D$ the drift velocity and B the magnetic field.

The Hall coefficient $R_H$ is determined by the generated voltage from the Lorentz force according to the equation:

$$V_{CA} = \frac{R_H}{d} I_{BD} |B|$$

In materials having a single carrier type, the sign of the Hall coefficient yields the type of charge carriers. A positive Hall coefficient indicates that the majority charge carrier type are holes. This material is called p-type. The material is called n-type when the Hall coefficient is negative. In $\beta$-$Ga_2O_3$ the majority charge carriers are electrons.

Considering the resistivity determined by the van der Pauw method, the charge carrier mobility is determined using:

$$\mu(T) = \sigma(T) \cdot R_H(T) = \frac{R_H(T)}{\rho(T)}$$

To determine the Hall coefficient, the applied current IBD was kept constant and the magnetic field B was varied from −300 mT to 300 mT. The temperature during the measurement process was kept at 20° C.

The inventors used a low-pressure reactor MOVPE system (Structured Materials Industries, Inc., USA) that comprised a vertical showerhead equipped with a rotating susceptor. This reactor was utilized for the deposition of n-type $\beta$-$Ga_2O_3$ thin films. The U.S. Pat. No. 6,289,842 B1 describes this type of reactor.

As a metalorganic precursor for Gallium (Ga) Triethylgallium (TEGa) and optional as a metalorganic precursor for the n-type doping by Si Tetraethylorthosilicate (TEOS) was used, while $O_2$ (5N) was used as an oxidant and high purity Ar (5N) acted as a carrier gas.

A high-quality semi-insulating ($1 \times 1017$ AT/$cm^3$, Mg-doped) $\beta$-$Ga_2O_3$ substrate having an orientation of 1-0-0 was grown via the Czochralski method. The document EP 3 242 965 A1 describes the method used for this process.

As a second class of samples, a sapphire substrate was placed in the process chamber during the deposition process (c-plane $Al_2O_3$ of dimensions $5 \times 5 \times 0.5$ mm$^3$).

The inventors realized that during the thin film deposition it is preferable to perform an in-situ reflectance monitoring. This was carried out by using a Laytec EpiNet system (EpiNet 2017, Laytec.-Germany) acquiring reflectance signals at 405 nm, 633 nm, and 950 nm, through a window normal to the substrate embedded on the top of the MOVPE chamber.

With a multichannel reflectance meter setup described in the previous section, the inventors measured the reflectance spectrum at 405 nm, 633 nm, and 950 nm simultaneously with the incident light normally on the substrate during the film growth.

Figure 2:
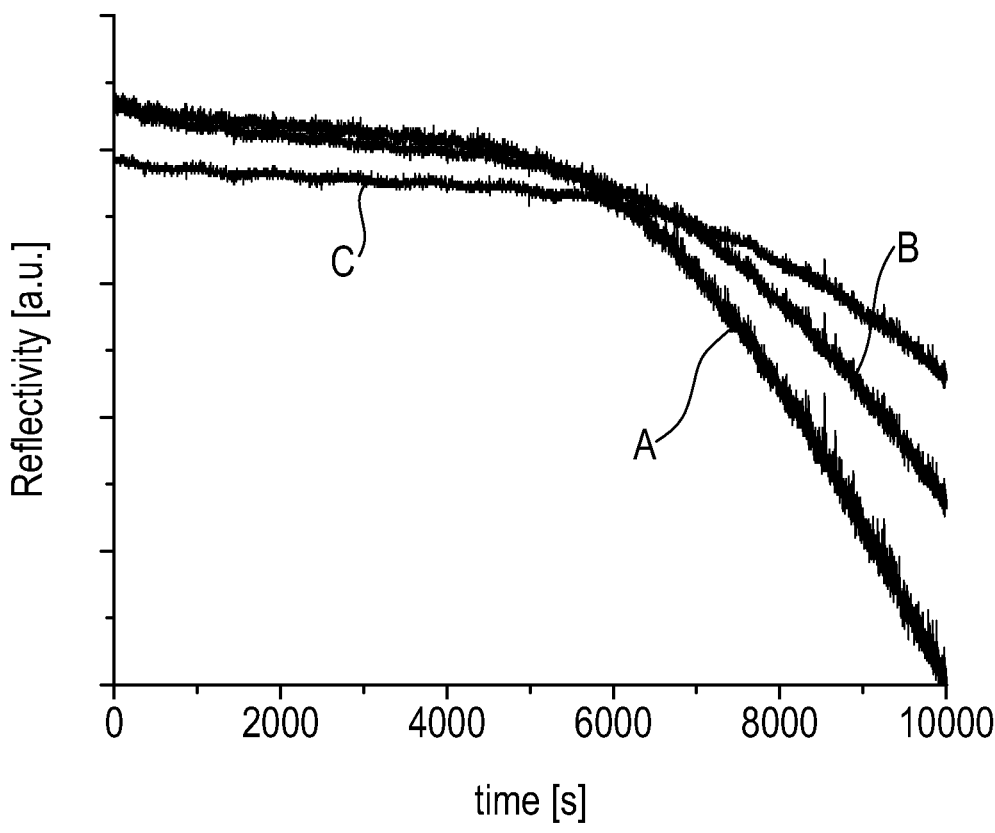
FIG. 2 shows a demonstration reflectivity.

FIG. 2 provides a demonstration of reflectivity, which was simultaneously measured during the deposition process is shown. Three different laser wavelengths were used (A: 405 nm, B: 633 nm and C: 950 nm).

Figure 3:
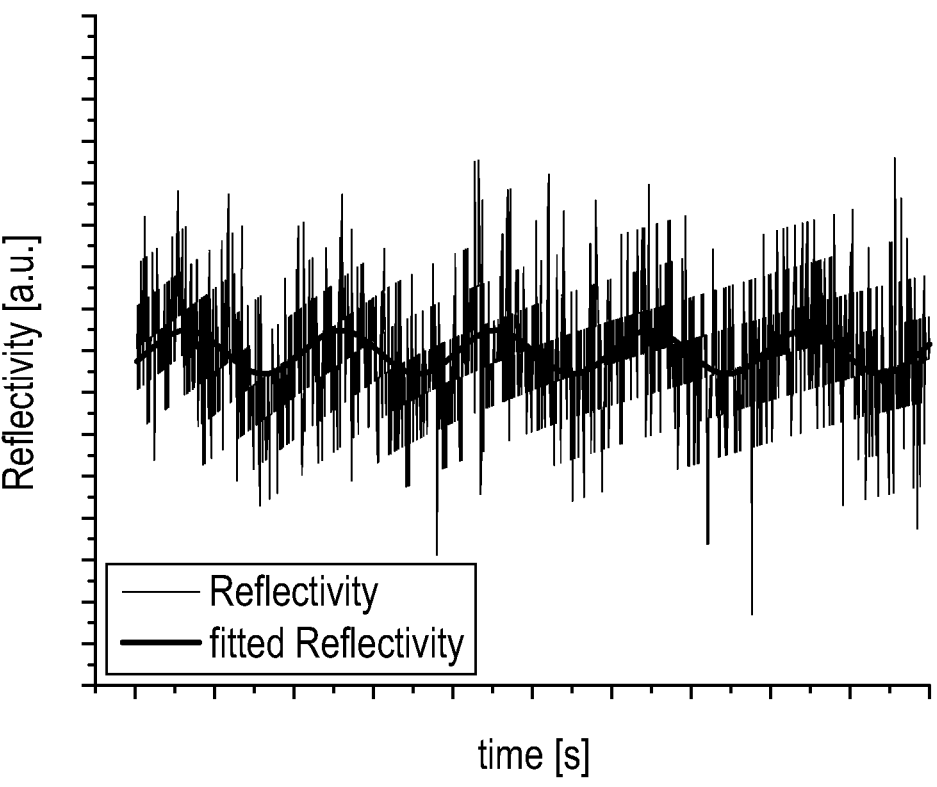
FIG. 3 shows reflectivity curve at a different scale as that shown in FIG. 2.

FIG. 3 shows a reflectivity curve, which was simultaneously measured during the deposition process. FIG. 3 uses a different scale as that shown in FIG. 2. A sinus function is fitted to the data in order to get the time difference between two neighboring maxima or minimal respectively.

After finishing the deposition, the growth mode of $\beta$-Ga$_2$O$_3$ thin films were investigated by atomic force microscopy (AFM) (Bruker Dimension Icon). The Si concentration was determined by the secondary ion mass spectrometry (SIMS) performed by RTG Mikroanalyse GmbH Berlin. The electrical data have been achieved by room temperature Hall effect measurements (Lake Shore HMS 7504, the U.S.A) using the Van der Pauw method with InGa eutectic ohmic contacts.

As published in Bin Anooz et al. the growth mode of homoepitaxially grown (1-0-0) $\beta$-Ga$_2$O$_3$:Si thin films can be classified into three categories:
 (1) step-flow
 (2) step-bunching
 (3) 2D-island growth It is known that these three growth modes are influenced by a variety of different process parameters. If the effective diffusion length is shorter than the terraces width, 2D island growth will take place and incoherent twin boundaries will form which influence the electrical properties. If the effective diffusion length is larger than the terrace width, step bunching will take place and rough facets will grow and finally if the diffusion length is in the order of the terraces step flow growth will occur.

The effective diffusion length can be influenced by, among other partially yet unknown factors:
 (1) The diffusion length of adatoms on the (1-0-0) surface of $\beta$-Ga$_2$O$_3$, which is temperature dependent. In addition, it can depend on the precursor or a surfactant effect of another material (contaminant). In case of a surfactant effect, the diffusion length of the adatoms on the surface of the other material is dominant in the growth process.
 (2) The number of adatoms reaching the surface. Too high adatom fluxes will reduce the effective diffusion length due to nucleation of two or more adatoms on the surface and these species having a slower diffusion.
 (3) The ambient pressure during growth.

The step-flow growth mode is most desirable since it allows the growth of layers with improved electrical properties. Whereas the 2D island growth is the worst mode concerning the desired electrical properties.

However, during the growth process fluctuations of the growth equipment for example (among other reasons) can happen very easily and thus cause the growth mode to change to an unfavorable category.

The longer the process takes and/or the thicker the deposited layer is, the less likely it is that there will be a layer with the desired electrical properties.

So, achieving a high deposition thickness still having the desired electrical properties is very demanding and for very high deposition thickness it is virtually impossible without sacrificing the benefit of favorable electrical properties. Those higher thicknesses are highly favorable for building vertical transistors.

The inventors discovered that the relation between the growth mode and the reflectance signal can be linked to each other by observing the change of the measured reflectance value. They further realized that the relative change of reflectance value represents the transition of the surface morphology.

The inventors further discovered that the sensitivity of the reflectance spectroscopy can reflect the growth mode transition during a two-layer growth process. The change of growth mode is believed to form an interface between layers and an additional reflectance contribution should be considered for the total reflectance of the grown film. A more complicated optical model is needed to explain the change of the observed oscillation; however, details are not known yet, but its effect can be utilized.

The inventors discovered that the preferred method to solve the above-mentioned problem comprises the steps which are described as follows:

Providing a substrate for the deposition, preferably the substrate is either made of $\beta$-Ga$_2$O$_3$ or sapphire. More preferably, the substrate is made of $\beta$-Ga$_2$O$_3$ having a crystal orientation of 1-0-0 and a doping concentration different from the doping concentration of the layer. Most preferably, the doping concentration of the substrate differs from the doping concentration of the layer by more than a factor of 2. Furthermore, it is preferable to have a miscut angle between 1° and 6°. Doping concentration is therefore obtained by a Hall measurement.

It is preferred to focus the light beam of the reflectance meter on the surface of the substrate used. Preferably, it is focused in the center of the substrate.

Stabilizing the deposition temperature is important to have a homogeneous ambient and substrate temperature. Preferably, the temperature of the substrate is set to a value that is not less than 790° C. and not more than 850° C. More preferably, the temperature is between 810° C. and 820° C.

After stabilizing the temperature, deposition is started by adding metal precursors and oxidants to the ambient in the process chamber. As a metal precursor it is preferred to use Triethylgallium (TEGa).

The chamber pressure is preferably set to not more than 40 mbar and not less than 10 mbar.

Further, it is preferred that a spectrum recording is active while the deposition takes place. The inventors realized that the best effect can be achieved when using a wavelength of the light being less than 500 nm. The inventors used three different laser sources for comparison (405 nm, 633 nm and 950 nm). They realized that the lower the wavelength of the laser the earlier the effect of an unwanted deviation in reflectivity can be detected. However, not scientifically proven, it is assumed that the laser detects some surface roughness and therefore the lower wavelength is more sensitive to a change in surface roughness. Therefore, it is preferred to use a laser having a wavelength of less than 500 nm.

The inventors further realized, that it is very difficult to measure the growth rate using a wavelength lower than 500 nm for a larger thickness of the layer. They further realized that a combination-measurement of a lower wavelength and a higher wavelength (above 900 nm) is highly preferred to overcome the problem.

The spectrum recording is preferably performed using the in-situ reflectance monitoring.

The growth rate can be determined by taking the time difference, between two neighboring peaks or the valleys from observed oscillation. This is for example shown in FIG. 3. The growth rate gr is then calculated using the formula:

$$g_r = \frac{\lambda}{2nd}$$

where n is the nominal refractive index of $\beta$-Ga$_2$O$_3$ (hence assumed to be 1.9), and the $\lambda$ [nm] is the wavelength of the spectrum of the used wavelength.

It is preferred to perform a first deposition cycle at a first growth rate using Oxygen and a precursor comprising Ga. The inventors discovered that it is helpful that the first deposition cycle is rather short in comparison to the complete deposition process. According to the findings of the inventors during this first deposition cycle it is preferred to measure and/or deduce some of the basic features of the actual deposition run. Preferably, the duration for the first deposition cycle is more than it takes to deposit at least 3 atomic layers of $\beta$-Ga$_2$O$_3$ (one atomic layer corresponds to a full period of oscillation with the wavelength of between 300 nm and 500 nm). More preferably, the duration of the first deposition cycle is no longer than it takes to deposit 20 atomic layers of $\beta$-Ga$_2$O$_3$. Or, in other words, for the thickness of the layer of the first deposition cycle it is preferred to be of at least 3 atomic layers of $\beta$-Ga$_2$O$_3$ and at most 20 atomic layers of $\beta$-Ga$_2$O$_3$.

Preferably, a regression curve for a layer surface reflectivity is determined using a plurality of tuples of a measured first layer surface reflectivity and a corresponding first layer thickness. The inventors realized that it is best if more than 200 tuples are used. The more tuples are generated the better the fit of the more reliable the fit will be. Most preferably, the regression curve is a straight line.

Preferably, during a second deposition cycle a second layer thickness and a second layer surface reflectivity is measured. A scaled reflectivity Rs is computed by dividing the measured second layer reflectivity by the value of the regression curve obtained by inserting the measured second layer thickness into the regression curve.

The pre-cursor flux during the second deposition cycle is set to a value which is determined from the pre-cursor flux during the first deposition cycle multiplied by a correction factor.

Figure 4:
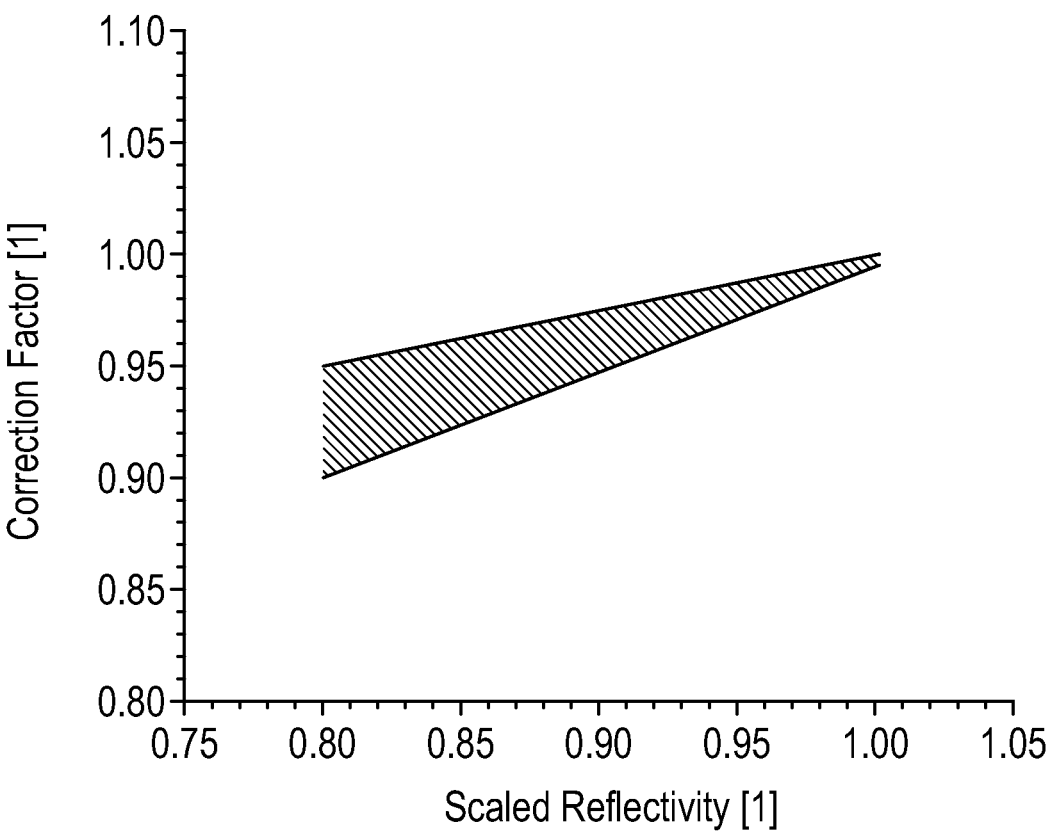
FIG. 4 shows a preferred area where a correction factor should preferably lie depending on the scaled reflectivity.

FIG. 4 shows a preferred area where a correction factor should preferably lie depending on the scaled reflectivity. The lower line corresponds to a function $L_l$=0.995–$R_s$×0.475 and the upper line to a function of $L_u$=1.0–$R_s$×0.25 where $R_s$ is the scaled reflectivity depicted on the x-axis.

As shown in FIG. 4, the correction factor is preferably is greater than a lower limit $L_l$, which is calculated as $L_l$=0.995–$R_s$×0.475 and smaller than an upper limit $L_u$, which is calculated as $L_u$=1.0–$R_s$×0.25 where $R_s$ is the above defined scaled reflectivity.

The inventors realized that it is beneficial to adjust the pre-cursor flux during growth according the above-mentioned procedure in order to prevent a growth mode that is harmful to the desired quality of the deposited layer. In other words, this procedure keeps the growth in a preferred window of operation.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method of growing a $\beta$-Ga$_2$O$_3$ layer on a substrate, the method comprising:

providing the substrate;

performing a first deposition cycle at a first growth rate using oxygen and a precursor comprising Ga, the first deposition cycle having a thickness of at least 3 atomic layers of $\beta$-Ga$_2$O$_3$ and at most 20 atomic layers of $\beta$-Ga$_2$O$_3$;

determining a regression curve for a layer surface reflectivity using a plurality of tuples of a measured first layer surface reflectivity and a corresponding first layer thickness; and performing a second deposition cycle comprising measuring a second layer thickness and a second layer surface reflectivity, with a predetermined second growth rate determined from the first growth rate multiplied by a correction factor F, wherein the correction factor F is greater than a lower limit $L_l$, which is calculated as $L_l$=0.995–Ref×0.475, and smaller than an upper limit $L_u$, which is calculated as $L_u$=1–Ref×0.25, wherein Ref represents a dimensionless layer surface reflectivity index calculated from the quotient of the measured second layer surface reflectivity and the extrapolated layer surface reflectivity from the regression curve evaluated at the second layer thickness.

2. The method according to claim 1, wherein the reflectivity measurement is carried out with a reflectance meter using a light source having a wavelength less than 500 nm.

3. The method according to claim 1, wherein the regression curve is a straight line.

4. The method according to claim 1, wherein the precursor comprising Ga is Triethylgallium.

5. The method according to claim 1, wherein the predetermined second growth rate is adjusted by the molar ratio of gallium to oxygen.

6. The method according to claim 1, wherein the predetermined second growth rate is adjusted by the molar ratio of gallium to oxygen and the deposition temperature of the substrate measured using a pyrometer.

* * * * *